(12) United States Patent
Somitsch et al.

(10) Patent No.: US 9,595,390 B2
(45) Date of Patent: Mar. 14, 2017

(54) METHOD FOR FILLING AT LEAST ONE CAVITY OF A MULTI-LAYER COMPONENT WITH A FILLING MATERIAL, AND MULTI-LAYER COMPONENT

(71) Applicant: EPCOS AG, Munich (DE)

(72) Inventors: Dieter Somitsch, Gross St. Florian (AT); Martin Galler, Kalsdorf (AT); Aditya Rajapurkar, Graz (AT)

(73) Assignee: EPCOS AG, Munich (DE)

( * ) Notice: Subject to any disclaimer, the term of this patent is extended or adjusted under 35 U.S.C. 154(b) by 139 days.

(21) Appl. No.: 14/420,653

(22) PCT Filed: Jul. 31, 2013

(86) PCT No.: PCT/EP2013/066117
§ 371 (c)(1),
(2) Date: Feb. 9, 2015

(87) PCT Pub. No.: WO2014/023634
PCT Pub. Date: Feb. 13, 2014

(65) Prior Publication Data
US 2015/0235770 A1    Aug. 20, 2015

(30) Foreign Application Priority Data
Aug. 9, 2012  (DE) .................. 10 2012 107 341

(51) Int. Cl.
*H01G 4/30*      (2006.01)
*H01L 41/083*    (2006.01)
(52) U.S. Cl.
CPC ............. *H01G 4/30* (2013.01); *H01L 41/083* (2013.01)
(58) Field of Classification Search
CPC  H01G 4/228; H01G 4/30; H01G 4/38; H01G 4/12; H01G 4/0085; H01G 4/2325;
(Continued)

(56) References Cited

U.S. PATENT DOCUMENTS 4,685,197 A * 8/1987 Tigelaar ............. H01L 21/8229
216/19
4,903,166 A * 2/1990 Galvagni ................. H01G 4/30
29/25.42
(Continued)

FOREIGN PATENT DOCUMENTS

CN       1856886 A    11/2006
CN     101874314 A    10/2010
(Continued)

OTHER PUBLICATIONS

ThreeBond Data Sheet: "1200 series", <http://www.threebond.co.jp/en/products/series/adhesives/s_a1200,html>, downloaded May 16, 2013.
(Continued)

*Primary Examiner* — Dion R Ferguson
(74) *Attorney, Agent, or Firm* — McDermott Will & Emery LLP

(57) ABSTRACT

The invention relates to a method for filling at least one cavity (5a, 5b) of a multi-layer component (1) with filling material (9). In a first step, the method comprises providing a main body (2) of the multi-layer component (1), the main body (2) having at least one cavity (5a, 5b). In a subsequent step, the method comprises placing the main body (2) in a chamber (11) and then generating a first pressure, the first pressure being a negative pressure. Then, a filling material (9) is arranged on the main body (2). Furthermore, the invention relates to a multi-layer component (1). The multi-layer component (1) has a main body (2) with at least one cavity (5a, 5b), wherein the cavity (5a, 5b) is filled with a filling material (9) which has a viscosity of between 200 mPas and 2000 mPas.

14 Claims, 5 Drawing Sheets

(58) Field of Classification Search
CPC .......... H01G 4/33; H01G 4/306; H01G 4/012; H01G 4/008; H01G 4/005
See application file for complete search history.

(56) References Cited

U.S. PATENT DOCUMENTS

| | | | |
|---|---|---|---|
| 5,597,494 A | 1/1997 | Kohno et al. | |
| 5,735,027 A * | 4/1998 | Hageman | H01G 4/30 29/25.35 |
| 2003/0223155 A1 | 12/2003 | Uchiyama | |
| 2005/0067744 A1* | 3/2005 | Miura | B32B 18/00 264/619 |
| 2005/0168106 A1 | 8/2005 | Iwase et al. | |
| 2006/0232172 A1 | 10/2006 | Asano et al. | |
| 2009/0320255 A1 | 12/2009 | Ganster et al. | |

FOREIGN PATENT DOCUMENTS

| | | |
|---|---|---|
| CN | 101978519 A | 2/2011 |
| DE | 4410504 A1 | 9/1994 |
| DE | 4410504 A1 | 9/1994 |
| DE | 102006000176 A1 | 11/2006 |
| DE | 102006001656 A1 | 2/2007 |
| DE | 10 2007 004 552 A1 | 7/2008 |
| DE | 102007004813 A1 | 8/2008 |
| DE | 102007004813 A1 | 8/2008 |
| EP | 1675190 A1 | 6/2006 |
| EP | 1942533 A1 | 7/2008 |
| JP | H0473977 A | 3/1992 |
| JP | H06283371 A | 10/1994 |
| JP | H03280481 B2 | 5/2002 |
| JP | 2004095593 A | 3/2004 |
| JP | 2005055489 A | 3/2005 |
| JP | 2005183607 A | 7/2005 |
| JP | 2006066878 A | 3/2006 |
| JP | 2006303044 A | 11/2006 |
| JP | 2012079816 A | 4/2012 |
| JP | H05267743 B1 | 8/2013 |
| WO | WO-2007049697 A1 | 5/2007 |

OTHER PUBLICATIONS

Wikipedia: "Schlicker"; <http://de.wikipedia.org/wiki/Schlicker>, downloaded May 16, 2013 (English counterpart attached).

* cited by examiner

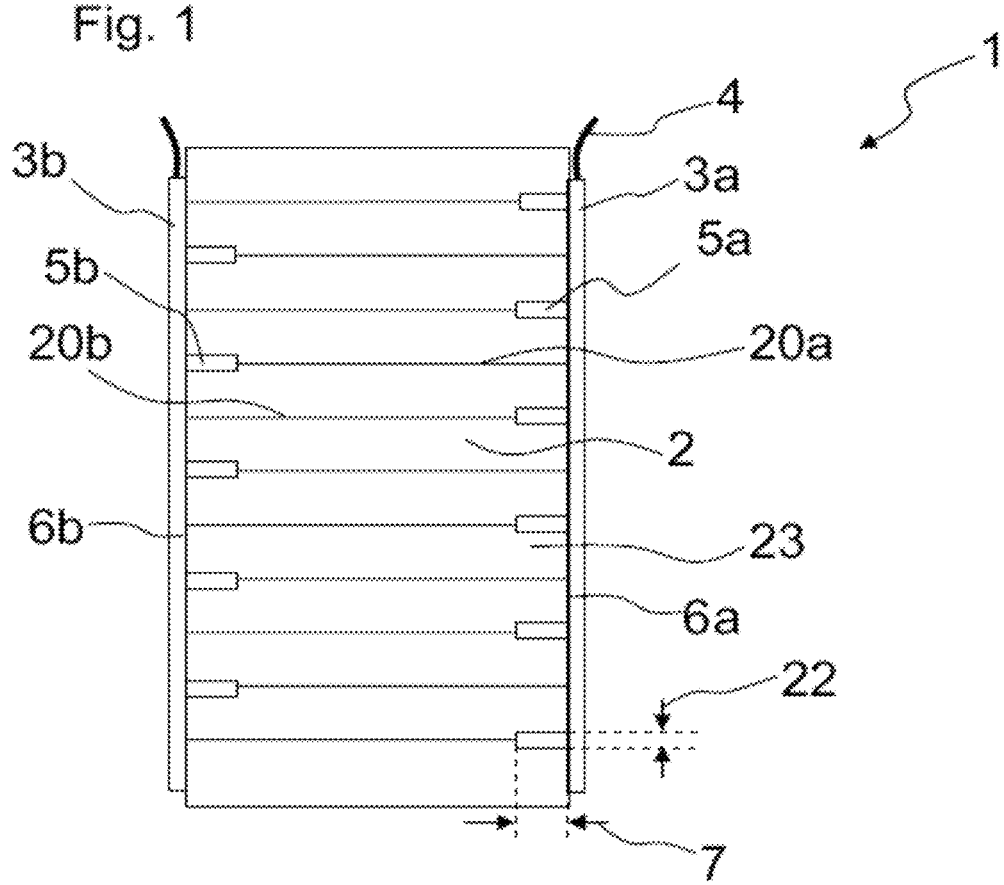

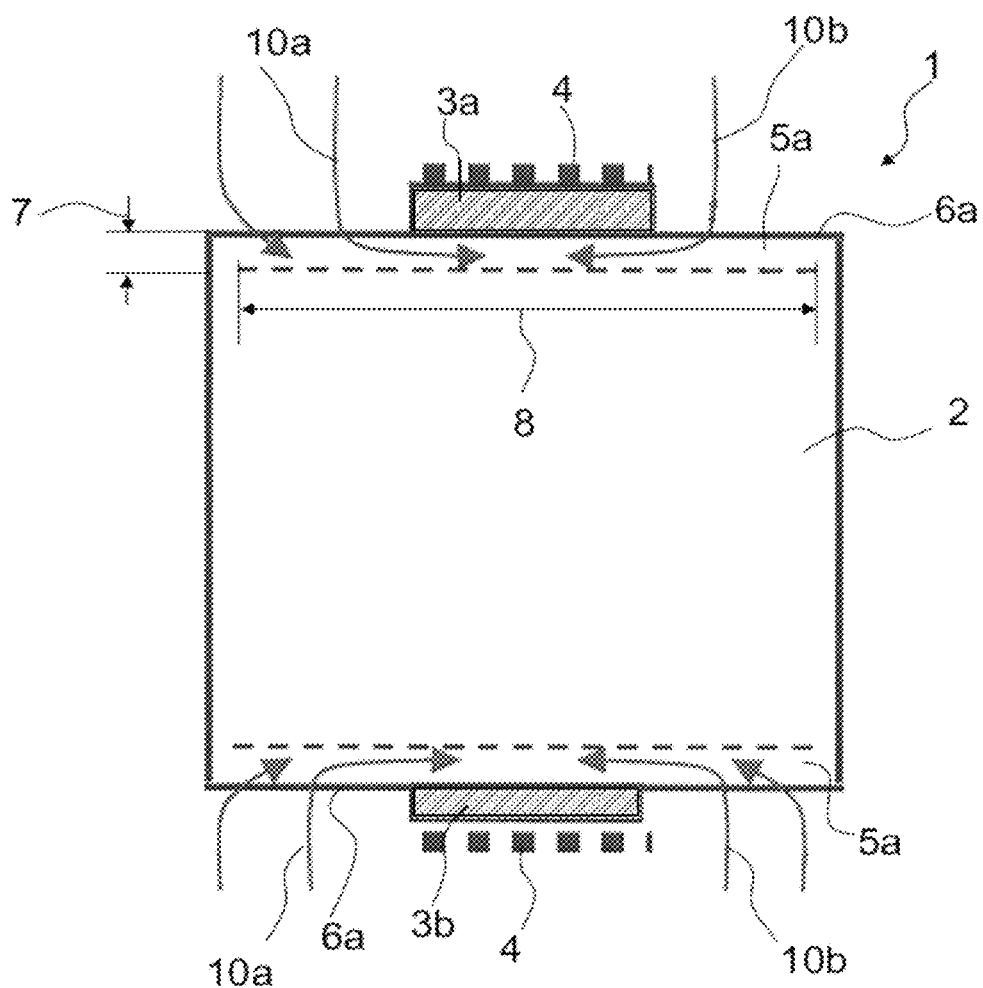

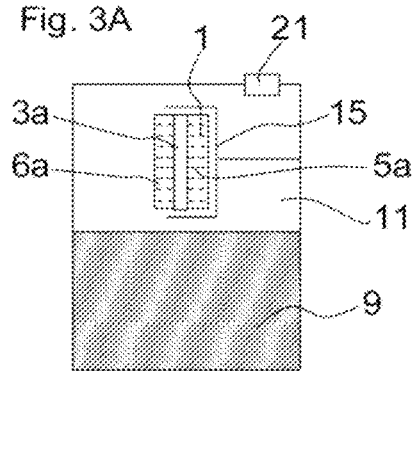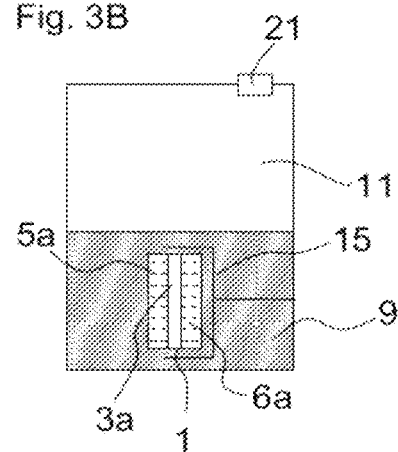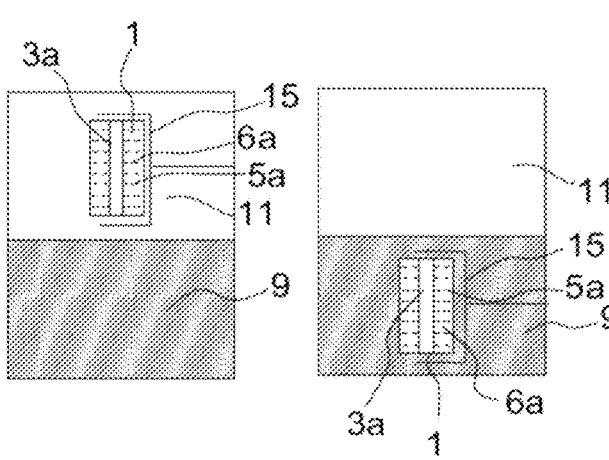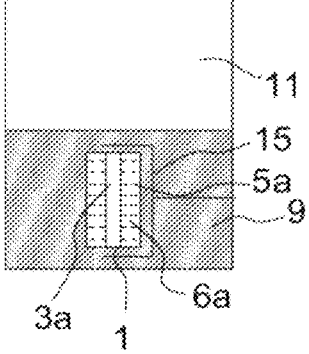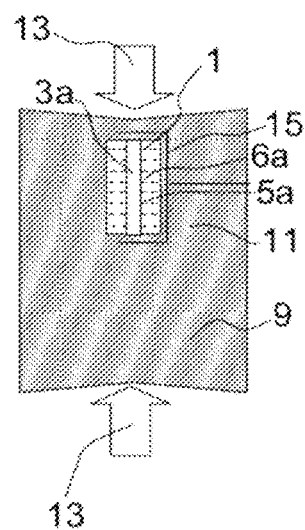

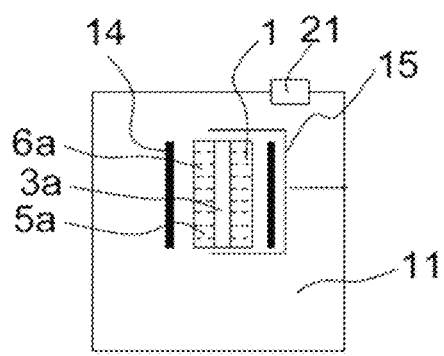
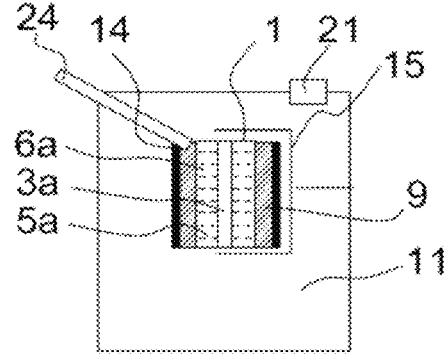
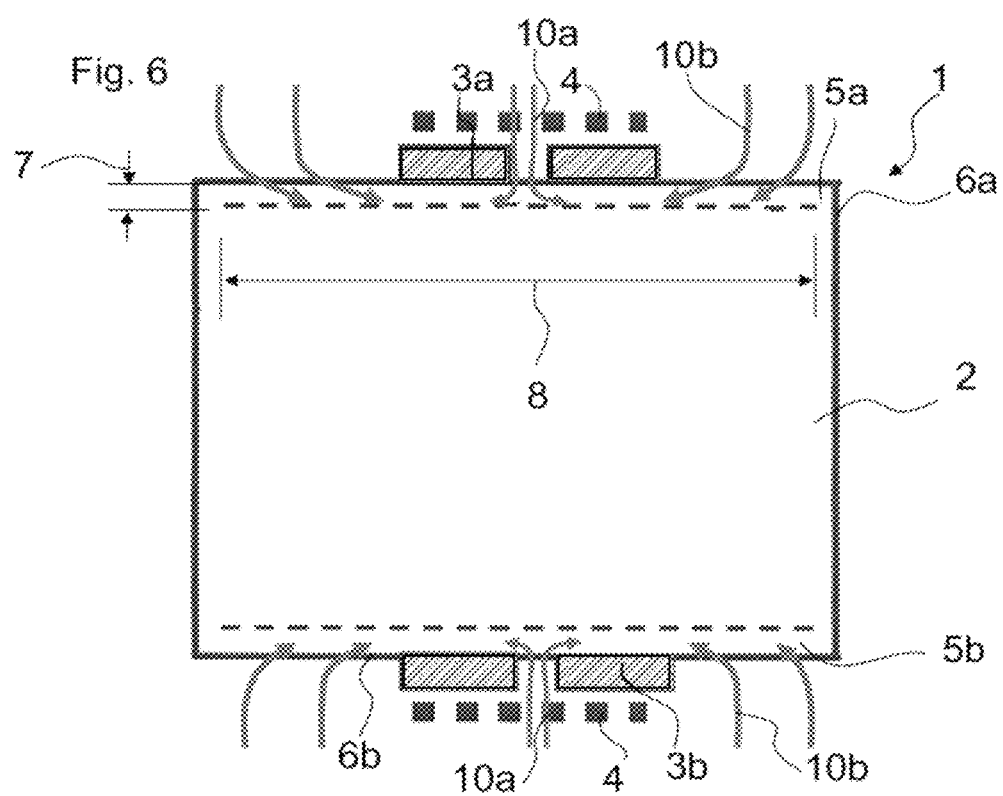

METHOD FOR FILLING AT LEAST ONE CAVITY OF A MULTI-LAYER COMPONENT WITH A FILLING MATERIAL, AND MULTI-LAYER COMPONENT

The invention relates to a method for filling at least one cavity of a multi-layer component with filling material and also to a multi-layer component. By way of example, the multi-layer component is a piezo actuator, which can be used for actuating an injection valve in a motor vehicle. Alternatively, the multi-layer component can be a multi-layer capacitor, for example.

The documents DE 10 2006 001 656 A1, DE 44 10 504 B4 and DE 10 2007 004 813 A1 describe electrochemical etching methods for forming insulation zones in multi-layer components.

It is an object to be achieved to specify an improved method for filling a cavity of a multi-layer component with filling material and a multi-layer component with improved properties.

The invention relates to a method for filling at least one cavity of a multi-layer component with filling material. In a first step, the method comprises providing a main body of the multi-layer component, the main body having at least one cavity. In a subsequent step, the main body is placed in a chamber. Then, a first pressure is generated in the chamber, the first pressure being a negative pressure. Then, filling material is arranged on the main body.

It is preferable that the main body is initially placed in the chamber in such a manner that it does not come into contact with filling material already present in the chamber.

It is preferable that air, in particular a majority of the air, is removed from the at least one cavity, such that the risk of later bubble formation in the insulating material is reduced.

The insulating material should preferably have the smallest number of bubbles possible. This can reduce the risk of an electrical breakdown, for example between an internal electrode layer of the main body and an outer contact-making means arranged on the main body.

The main body can have a stack of dielectric layers and internal electrode layers. By way of example, dielectric layers and internal electrode layers are stacked along a stacking direction. The stacking direction preferably corresponds to the longitudinal direction of the main body. It is preferable that dielectric layers and internal electrode layers are stacked alternately one on top of another.

In one embodiment, the main body has first and second internal electrode layers which follow one another in alternation as seen in the stacking direction. The first internal electrode layers extend as far as a first outer side, and the second internal electrode layers extend as far as a second outer side. The first and the second outer sides lie opposite one another, for example.

The dielectric layers can comprise a piezoelectric material, for example a ceramic material. To produce the main body, use can be made of green sheets, to which a metal paste, for example, is applied to form internal electrode layers. By way of example, the metal paste is applied in a screen printing method. The metal paste can contain copper. By way of example, internal electrode layers containing copper as the main constituent are formed therefrom. Alternatively, the metal paste can contain silver-palladium, in which case internal electrode layers containing silver-palladium as the main constituent can be formed therefrom. After the metal paste has been applied, the sheets are preferably stacked, pressed and sintered together, such that a monolithic sintered body is formed. It is preferable that the main body of the component is formed by a monolithic sintered body, for example by a sintered body produced in the manner described above.

The at least one cavity of the main body can be formed as a trench, for example. The cavity, in particular the trench, can be arranged in a plane with a respective internal electrode layer. In particular, the cavity can be arranged between an internal electrode layer and an outer side of the main body. It is preferable that the cavity, in particular the trench, reaches as far as an outer side of the main body. As a result, the cavities are accessible at least partially from the outer side. In particular, the cavities can be accessible from the outer side in a region which is not covered by an outer contact-making means.

The main body preferably has a multiplicity of cavities, in particular trenches. In the case of first and second internal electrode layers which reach alternately as far as a first and a second outer side, it is the case, for example, that a cavity is arranged between each first internal electrode layer and the first outer side of the main body. A cavity can be arranged on the opposite, second outer side of the main body between each second internal electrode layer and the second outer side of the main body. As a result, the first and second internal electrode layers can be spaced apart alternately from a first and a second outer side of the main body.

The cavities are produced, for example, by an etching method. By way of example, the main body can be arranged in an etching medium in order for the cavities to be etched, while a voltage is applied between the internal electrode layers by means of electrodes. The application of a voltage makes it possible for part of the electrode to be etched away, such that a cavity is formed between the internal electrode layer and an outer side of the main body.

By way of example, a cavity has a width of between 1 μm and 5 μm. The width of the cavity preferably corresponds to an extent of the cavity along the stacking direction of the main body. On account of this small width, the cavities are difficult to fill. In particular, materials having high viscosities can only be introduced into the cavities with difficulty. Furthermore, the cavity can have a depth of between 80 μm and 120 μm. Moreover, the cavity can have a length of between 3 mm and 4 mm. The length of the cavity preferably corresponds to an extent of the cavity perpendicular to the stacking direction of the main body.

Since the cavities have dimensions in the micrometer range, mention is also made of microstructured cavities.

The filling material is, for example, an insulating material. By way of example, the insulating material has a viscosity of between 200 mPas and 2000 mPas. According to a preferred embodiment, the insulating material has a viscosity of between 300 mPas and 500 mPas. By way of example, the insulating material is a silicone elastomer or a polyimide or contains a silicone elastomer or a polyimide constituent. By way of example, the insulating material is a casting compound. The insulating material preferably has a low shrinkage behavior on curing. Moreover, the insulating material preferably has a low vapor pressure, and therefore the insulating material does not begin to evaporate when a negative pressure is generated. Moreover, the insulating material should not contain any fillers, which can block the trenches. In addition, the insulating material should not have a yield point or should have the lowest possible yield point. The yield point describes the force which has to be applied in order to permanently deform a substance.

The filling of the cavities with the insulating material allows for the formation of insulating zones which can insulate an internal electrode layer particularly reliably from an outer contact-making means.

The cavities can be filled with insulating material in order to increase the dielectric strength, in particular in order to avoid an electrical breakdown between an internal electrode layer and an outer contact-making means when a voltage is applied between the internal electrode layers.

According to one embodiment, at least one outer contact-making means is arranged on the main body already before the main body is placed in the chamber. By way of example, the outer contact-making means at least partially covers the at least one cavity of the main body. By way of example, the outer contact-making means comprises silver-palladium or copper or silver or consists of silver-palladium or copper or silver. The outer contact-making means is applied to an outer side in strip form, for example. By way of example, the outer contact-making means is applied by means of screen printing. In particular, the outer contact-making means can be fired in. It is preferable for a respective outer contact-making means to be arranged on two opposing outer sides of the main body. The outer contact-making means can partially cover the at least one cavity on an outer side of the main body. It is preferable that the outer contact-making means covers the at least one cavity of the main body in such a manner that the cavity is still accessible from outside, in particular is accessible via the outer side of the main body.

The method is suitable in particular for filling a cavity even underneath an applied outer contact-making means with insulating material. This has the advantage that it is also possible to use insulating materials which can become damaged as the outer contact-making means is being fired in.

According to an alternative method, the outer electrodes can also be applied after the cavities have been filled with insulating material.

It is preferable that a contact element is arranged on the outer contact-making means. The contact element preferably serves for making a further contact connection with the multi-layer component. The contact element can have a contact wire, for example. In addition or as an alternative, the contact element can have a reinforcing element, for example a screen fabric or a wire harp, which can be arranged on the outer contact-making means. The contact element is soldered to the outer contact-making means, for example. The contact wire can be arranged, for example, on the outer contact-making means or on the reinforcing element.

By way of example, the outer contact-making means can have a gap, which extends in the longitudinal direction of the outer contact-making means. The gap gives rise to an additional opening on the outer side of the main body, through which the insulating material can flow under the outer contact-making means into the cavity.

To fill the at least one cavity with insulating material, an insulating material can be arranged in the chamber already as the main body is being placed in the chamber, for example. Alternatively, the insulating material may only be introduced into the chamber in a later method step.

The main body can be placed in the chamber with the aid of a clamping apparatus. The clamping apparatus is a clamp, for example. The main body can be fastened in the clamping apparatus in such a manner that a top side and a bottom side of the main body are covered. In addition, regions which are provided for making a further contact connection with the multi-layer component can also be covered. By way of example, a screen mesh attached to the outer contact-making means for making a further contact connection can be covered. This ensures that it is possible to make a reliable contact connection with the multi-layer component. In particular, the electrical contact connection is not influenced by insulating material possibly adhering at the further contact connection.

According to one embodiment, the main body can be arranged in a sleeve. The main body can be fastened in the clamping apparatus and placed in the chamber together with the sleeve. By way of example, the sleeve can remain on the component after the at least one cavity has been filled with insulating material. By way of example, the sleeve can serve to protect the multi-layer component, for example against dirt or mechanical influences, during later use of the multi-layer component.

According to one embodiment of the method, the main body is immersed into the insulating material already present in the chamber after the main body has been placed in the chamber and the first pressure, in particular a negative pressure, has been generated. Alternatively, the chamber is filled completely with insulating material. Alternatively, only a sleeve, in which the main body can be arranged, is filled with insulating material, for example by means of a probe. The insulating material introduced into the sleeve can also remain in the sleeve and be cured after the filling process. In particular, the insulating material located in the sleeve can surround the main body after curing and serve as a passivation material.

According to a preferred embodiment, the main body comes into contact with insulating material in such a manner that at least those regions of the main body in which the trenches are accessible from outside are covered with insulating material.

In a subsequent method step, the pressure in the chamber is increased to a second pressure. By way of example, the pressure is increased by aerating the chamber. According to one embodiment, the pressure in the chamber is increased to normal air pressure. The chamber can be aerated and deaerated by way of a valve, for example. After the chamber has been aerated, the pressure can be increased still further. In particular, an excess pressure can be applied. In particular, the insulating material is subjected to the second pressure.

Alternatively, the pressure in the chamber can be generated by the deformation of at least one outer wall of the chamber. In this case, the chamber is preferably filled completely with insulating material. The chamber can be deformed by the application of force, for example by means of a press. Deformation of this nature reduces the volume of the interior. On account of an extensive incompressibility of the insulating material, the pressure of the insulating material is increased as a result.

The insulating material can be pressed into the at least one cavity of the main body by such an increase in the pressure.

According to one embodiment of the method, a diaphragm can be arranged over the at least one cavity of the main body, in particular a part of the cavity which is accessible from outside.

It is preferable that no insulating material can flow directly into the cavity in the region in which the diaphragm is arranged. It is preferable that the insulating material can flow in only via a region of the cavity which is not covered by the diaphragm or the outer contact-making means.

The diaphragm is preferably arranged in such a manner that, together with the outer contact-making means, it covers a continuous region on the outer side of the main body. In particular, the diaphragm covers a region of the at least one cavity, such that the latter is no longer directly accessible from outside in this region. It is preferable that the diaphragm covers a region on the outer side of the main body which lies next to the outer contact-making means, and that the width of the diaphragm is greater than the width of a region covered continuously by the outer contact-making means. The width of the region covered by the diaphragm and the outer contact-making means preferably corresponds to an extent of the region perpendicular to the stacking direction of the main body. A continuously covered region is, for example, a region on the outer side of the main body in which the at least one cavity is not accessible from outside. In particular, no opening through which material can flow into the at least one cavity is located in the covered region.

The insulating material can flow into a region beneath the outer contact-making means through at least two inlet openings, for example. By way of example, the inlet openings can adjoin the ends of the continuously covered region. It is preferable that the insulating material can flow into the region under the outer contact-making means and under the diaphragm in a symmetrical manner. That is to say, the insulating material flows through the inlet openings from the outer contact-making means and from the diaphragm at the same speed into the trenches, such that the streams of the insulating material can come together in the center of the covered region. Since the width of the diaphragm in a region next to the outer contact-making means is greater than the width of the outer contact-making means, the center of the covered region does not lie beneath the outer contact-making means.

Air present in the cavities is pushed along in front of the streams of material as the insulating material flows into a cavity, for example. As a result, air inclusions, in particular bubbles, arise particularly frequently in a region in which the streams of the insulating material come together. The arrangement of the diaphragm as described above therefore makes it possible to avoid the formation of bubbles in a region beneath the outer contact-making means. This reduces the risk of an electrical breakdown between an internal electrode layer and the outer contact-making means.

It is preferable that air, in particular a majority of the air, is removed from the cavities by the application of the negative pressure before the cavities are filled with insulating material, such that no air bubbles can form in the cavities when the streams of the insulating material come together. If air bubbles nevertheless form, as described above it is possible by virtue of the diaphragm to displace the location at which the streams of the insulating material come together in such a manner that air bubbles which possibly form preferably do not arise in a region beneath the outer contact-making means. The air bubbles are then preferably located in a non-critical region, in which no electrical breakdown can occur between the outer contact-making means and an internal electrode layer.

In addition, the diaphragm can also be arranged over the outer contact-making means, such that at least part of the outer contact-making means is covered by the diaphragm. In addition, the diaphragm can cover at least part of the contact element, in particular part of the reinforcing element. As a result, virtually no insulating material can be deposited on the outer contact-making means or on the contact element at least in the covered region. It is therefore possible to make a reliable contact connection with the multi-layer component.

In a subsequent step, the multi-layer component thus formed can be removed from the chamber. If an excess pressure prevails in the chamber, pressure equalization preferably takes place before the multi-layer component is removed from the chamber.

Then, the insulating material can be cured.

The differential pressure which is required between the first and the second pressure for reliably filling the trenches can be calculated on the basis of Stokes' law and the Hagen-Poiseuille law.

In particular, the drop in pressure in a straight pipeline can be calculated with a laminar pipe flow. The pipeline can in this case serve as a substitute model for a cavity of the main body lying under the outer contact-making means.

The model used for this purpose is the flow through a pipe having small dimensions. This model corresponds to a standard example in fluid mechanics. Here, it is assumed that the flow conditions in a gap are more favorable than in the pipe model used. Furthermore, when a pipe or a gap is being filled more favorable conditions are present than when flow passes through a corresponding pipe or gap. Therefore, the real situation is more favorable than the calculation model described. In reality, the pressure difference required is therefore lower than that calculated hereinbelow.

The following parameters are stipulated in the calculation model:

a pipe radius $r_0$ of 1 μm;
a pipe length l of 1 mm;
a dynamic viscosity η of 400 mPas;
an average flow rate $V_{ave}$ of 10 μm/s.

These parameters are intended to depict a comparable situation to a main body having a cavity of width 2 μm and a width of an outer contact-making means of 2 mm. This is possible since the region under the outer contact-making means can be considered approximately to be a pipe.

From the formula $$V_{ave}=(p_2-p_1)*r_0^2/(8\eta l),$$

the following follows for the required differential pressure:

$$(p_2-p_1)=V_{ave}(8\eta l)/r_0^2=10^{-5}*(8*0.4*10^{-3})/(10^{-6})^2=3.2*10^4 \text{ N/m}^2=320 \text{ mbar},$$

where $p_1$ corresponds to the first pressure and $p_2$ corresponds to the second pressure.

The invention moreover relates to a multi-layer component. The multi-layer component has a main body with at least one cavity, wherein the cavity is filled with a filling material which has a viscosity of between 200 mPas and 2000 mPas. It is preferable that the filling material has a viscosity of between 300 mPas and 500 mPas. It is preferable that the cavity extends up to an outer side of the main body.

The filling material is, for example, an insulating material as described above.

The cavity of the multi-layer component preferably has a width of between 1 μm and 5 μm. Moreover, the cavity can have a depth of between 80 μm and 120 μm. In addition, the cavity can have a length of between 3 mm and 4 mm.

It is preferable that the multi-layer component is produced by a method as described above and can have all the functional and structural properties of the multi-layer component described with respect to the method.

Hereinbelow, the method for producing a multi-layer component and the multi-layer component will be explained on the basis of schematic figures which are not true to scale and in which:

FIG. 1 shows a longitudinal section of a multi-layer component,

FIG. 2 shows a cross section of the multi-layer component shown in FIG. 1,

Figure 7:
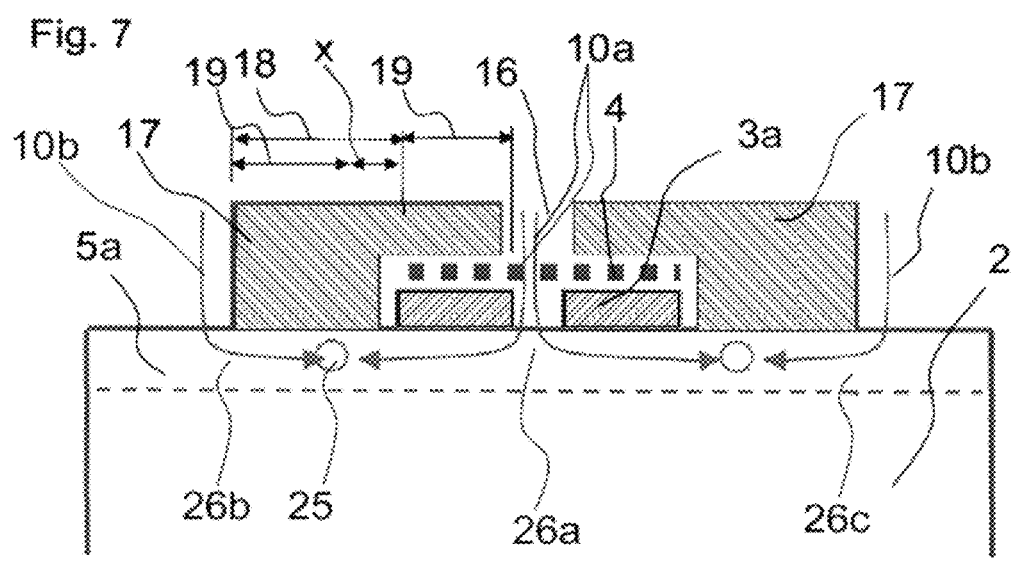

FIGS. 3A and 3B show a method sequence for filling cavities of a multi-layer component with filling material, FIGS. 4A to 4C show an alternative method sequence for filling cavities of a multi-layer component with filling material, FIGS. 5A and 5B show a further alternative method sequence for filling cavities of a multi-layer component with filling material, FIG. 6 shows a cross section of a further multi-layer component, FIG. 7 shows an excerpt from the cross section of a multi-layer component shown in FIG. 6, with a diaphragm arranged on the multi-layer component.

FIG. 1 shows a cross section of a multi-layer component 1. By way of example, the multi-layer component 1 is a piezo actuator or a multi-layer capacitor. The multi-layer component has a main body 2 with outer contact-making means 3a, 3b arranged thereon. The main body is, for example, a stack of piezoelectric layers 23 and internal electrode layers 20a, 20b arranged therebetween.

In addition, the main body has first and second cavities 5a, 5b, in particular first and second trenches. In particular, the cavities 5a, 5b are arranged on two opposing outer sides 6a, 6b. The cavities 5a, 5b are produced, for example, by an etching method. By way of example, the cavities 5a, 5b have a width 22 of between 1 μm and 5 μm, a depth 7 of between 80 μm and 120 μm and a length 8 of between 2 mm and 10 mm (see also FIG. 2).

By way of example, the first and second cavities 5a, 5b are arranged in a plane with first and second internal electrode layers 20a, 20b of the main body 2. In particular, the cavities 5a, 5b are each arranged between an outer side 6a, 6b of the main body 2 and first and second internal electrode layers 20a, 20b. By virtue of the cavities, the internal electrode layers are spaced apart from an outer side 6a, 6b. The first cavities 5a are open toward a first outer side 6a, and the second cavities 5b are open toward a second outer side 6b. An outer contact-making means 3a, 3b arranged on the outer sides 6a, 6b covers the cavities 5a, 5b only partially, as shown in FIG. 2 for example. In particular, the cavities 5a, 5b are accessible from the respective outer side 6a, 6b and, as described below, can be filled with a filling material, in particular an insulating material.

A suitable insulating material is, for example, a silicone elastomer having a viscosity of 400 mPas.

By virtue of a second cavity 5b filled with filling material, the first internal electrode layers 20a can be reliably insulated from a second outer contact-making means 3b. In this way, it is possible to avoid an electrical breakdown between the outer contact-making means 3b and an internal electrode layer 20a. In the same way, a second internal electrode layer 20b can be insulated from a first outer contact-making means 3a.

In addition or as an alternative, the cavities 5a, 5b can act as predetermined breaking regions. By way of example, a cavity 5a, 5b filled with filling material can form a region of reduced fracture strength, which can break down when a voltage is applied to the multi-layer component 1.

The outer contact-making means 3a, 3b are arranged on respectively opposing outer sides 6a, 6b of the main body 2. By way of example, the outer contact-making means 3a, 3b comprise a metal-containing material. By way of example, the outer contact-making means 3a, 3b comprise silver-palladium or copper or silver, or consist of silver-palladium or copper or silver. The outer contact-making means 3a, 3b are applied, for example, by means of screen printing and then fired in. By way of example, the outer contact-making means 3a, 3b have a strip-like form. In particular, the outer contact-making means 3a, 3b are arranged on the outer sides 6a, 6b on which the cavities 5a, 5b are arranged. The outer contact-making means 3a, 3b cover the cavities 5a, 5b at least partially. A contact element 4 is arranged on each of the outer contact-making means 3a, 3b. The contact element 4 is soldered to the outer contact-making means 3, for example. By way of example, the contact element can have a contact wire. In addition, the contact element 4 can have a reinforcing element, for example a screen fabric or a wire harp.

The cavities 5a, 5b are filled with filling material as described below.

FIG. 2 shows a sectional illustration of the multi-layer component 1 shown in FIG. 1 in a plan view. It can be seen here that the outer contact-making means 3a, 3b are arranged over the cavities 5a, 5b, such that they cover part of the cavities 5a, 5b. In particular, the outer contact-making means 3a, 3b have a strip-like form, and do not extend over the entire width of the multi-layer component 1. Since, however, the cavities 5a, 5b extend virtually completely over the entire width of the multi-layer component 1, the cavities 5a, 5b are still accessible via an outer side 6a, 6b. In particular, the cavities 5a, 5b can be filled with filling material via the outer sides 6a, 6b.

A contact element 4 having a screen mesh is arranged on each of the outer contact-making means 3a, 3b.

In FIG. 2, the stream of the filling material is denoted by arrows 10a, 10b.

FIGS. 3A and 3B schematically show a method sequence for filling the cavities 5a, 5b of a multi-layer component as shown in one of FIGS. 1 and 2 with filling material 9. The filling material has a viscosity of between 200 mPas and 2000 mPas, for example. By way of example, the filling material has a viscosity of between 300 mPas and 500 mPas. A filling material 9 having such a viscosity does not flow independently into the cavities 5a, 5b with the dimensions as described above. A filling material 9 of this type can be diluted with a solvent, for example, so that it has a lower viscosity. As a consequence of the solvent drying during curing, however, the use of such solvents can cause the formation of bubbles in the filling material 9. On the basis of the method according to the invention, the filling material 9 can be introduced into the cavities as described hereinbelow without the use of a solvent being necessary.

Firstly, in order to fill the cavities with filling material 9, the multi-layer component 1 is placed in a chamber 11. For the sake of simplicity, the cavities 5a, which extend as far as an outer side 6a, are shown as dashed lines in FIGS. 3A and 3B. Cavities 5b are present accordingly on an opposing outer side 6b, which is not visible in the following figures. By way of example, the multi-layer component 1 is formed as shown in FIG. 1.

A filling material 9 is located in the chamber 11. The multi-layer component 1 is firstly placed in the chamber 11 without coming into contact with the filling material 9, as shown in FIG. 3A. By way of example, the multi-layer component 1 is clamped in a clamping apparatus 15.

After the multi-layer component 1 has been placed in the chamber 11, a first pressure, in particular a negative pressure, is generated, for example. By way of example, a vacuum can be generated. By way of example, the first pressure lies between 0 mbar and 300 mbar. It is preferable that the first pressure lies between 5 mbar and 20 mbar. The pressure can be matched in particular with the vapor pressure of the filling material 9. This makes it possible to prevent the filling material 9 from evaporating. The generation of the negative pressure in the chamber 11 makes it possible, for example, for air to be removed from the cavities 5a, 5b, in order to avoid the later formation of bubbles in the filling material 9.

As shown in FIG. 3B, the multi-layer component is immersed into the filling material 9 after the application of the first pressure, such that the exposed points of the cavities 5a, 5b are covered completely with filling material.

Then, the pressure in the chamber 11 is increased to a second pressure. For this purpose, a valve 21 is arranged in the chamber 11, for example in a cover of the chamber 11. In particular, the filling material 9 is pressurized. This is done by aerating the chamber 11 or by generating an excess pressure, for example. By way of example, the pressure in the chamber is increased by 300 mbar to 2000 mbar compared to the first pressure. It is preferable that the pressure in the chamber 11 is increased by 900 mbar to 1100 mbar. By way of example, the second pressure corresponds to normal air pressure. Through the increase in the pressure, the filling material 9 can flow into the cavities 5a, 5b of the multi-layer component 1. In particular, the filling material 9 is pressed into the cavities 5a, 5b. In particular, the filling material 9 is also pressed into the regions of the cavities 5a, 5b which are covered by an outer contact-making means 3a, 3b. The flow of the filling material into the cavities is shown in FIG. 2 by arrows 10a, 10b. In particular, a filling material 9 having a relatively high viscosity can flow into the cavities 5a, 5b without the use of a diluent being required. It is thereby possible to avoid voids in the filling material, which can form upon curing of a solvent-containing filling material. The flow of the filling material into the cavities is shown in the figures by arrows 10.

Then, the multi-layer component is removed from the chamber 11. After the filling material 9 has cured, for example by the introduction of heat, the multi-layer component 1 can be processed further.

FIGS. 4A, 4B and 4C schematically show an alternative method sequence for filling the cavities 5a, 5b of a multi-layer component 1 as shown in one of FIGS. 1 and 2 with filling material 9. Firstly, in a step 4A, the multi-layer component is positioned in a chamber 11, as already described in conjunction with FIG. 3A. The chamber 11 is partially filled up with a filling material 9. Then, as described above, a first pressure, in particular a negative pressure, is generated in the chamber 11.

In a subsequent step 4B, the main body 2 can be immersed in filling material, as shown in FIG. 3B, such that the cavities 5a, 5b of the main body are covered with filling material 9. Then, the chamber 11 is aerated and, as shown in FIG. 4C, filled further with filling material 9, until the chamber 11 is preferably filled completely. The chamber 11 is subsequently closed. Then, the chamber 11 is deformed by the application of force, for example by a press. The application of force is denoted by arrows 13 in FIG. 4C. The deformation of the chamber 11 increases the pressure on the filling material 9. As a result, filling material 9 is pressed into the cavities 5a, 5b analogously to the method step described in FIG. 3B. Since a high pressure can be built up in the filling material 9 by a press, this method is particularly suitable for high viscosity filling materials.

FIGS. 5A and 5B schematically show a further alternative method sequence for filling the cavities 5 of a multi-layer component as shown in one of FIGS. 1 and 2 with filling material 9. The multi-layer component 1 is firstly placed in a sleeve 14. Then, the multi-layer component is positioned with the sleeve 14 in a chamber 11. For this purpose, the sleeve 14 can be clamped in a clamping apparatus 15. Thereafter, a first pressure, in particular a negative pressure, is generated in the chamber 11.

In a subsequent step, as shown in FIG. 5B, the sleeve 14 is filled with filling material 9, for example by means of a probe 24. Then, the chamber 11 is aerated via a valve 21, for example, or a second pressure, in particular an excess pressure, is generated. As a result, the filling material 9 is pressed into the cavities 5a, 5b of the multi-layer component 1. The sleeve 14 protects the multi-layer component 1 against dirt or mechanical influences, for example. In particular, the sleeve 14 allows for a sparing use of filling material, since the chamber 11 does not have to be filled with filling material. In addition, the filling material 9 can remain in the sleeve 14 and after curing can serve as a passivation material.

The methods described in conjunction with FIGS. 3A to 5B have the advantage that cavities of a multi-layer component can be filled with filling material which has a relatively high viscosity without the addition of a diluting solvent being required. As a result, the formation of bubbles in the filling material can be reduced.

FIG. 6 shows a sectional illustration of a further multi-layer component 1. The multi-layer component 1 has a form similar to the multi-layer component shown in FIGS. 1 and 2, apart from the shape of the outer contact-making means 3. The outer contact-making means 3a of the multi-layer component 2 shown in FIG. 6 has a gap 16 along the stacking direction of the main body 2. The gap 16 has a width of between 300 µm and 800 µm, for example. The width of the gap 16 corresponds to an extent of the gap 16 perpendicular to the stacking direction of the main body 2. On account of the gap 16, the further contact-making means 4 can bridge a crack arising in the outer contact-making means 3a, for example. In addition, a better flow around the outer contact-making means 3a may be possible, since the filling material has to cover a shorter distance in the region which is difficult to access under the outer contact-making means 3a.

The possible stream of the filling material is denoted by arrows 10a, 10b. In particular, the filling material can be pressed into the cavities 5a via a region on the outer side 6a which lies next to the outer contact-making means 3a and via a region on the outer side 6a which lies under the gap 16, as described in conjunction with FIGS. 3A to 5B, and can thereby pass into the region beneath the outer contact-making means 3a.

On an opposing outer side 6b, the filling material can be pressed analogously into the cavities 5b.

FIG. 7 shows the multi-layer component shown in FIG. 6 with two diaphragms 17 additionally arranged over the outer contact-making means 3a. The diaphragms 17 are arranged symmetrically over the outer contact-making means 3a. The gap 16 in the outer contact-making means 3a is not covered by the diaphragms 17. A diaphragm 17 can be a component part of the clamping apparatus 15 or a separate component. A diaphragm 17 is arranged over the outer contact-making means 3a in such a manner that, together with the outer contact-making means, it covers a continuous region of the outer side 6a of the main body and in particular a cavity 5a. In the covered region, the cavities 5a are not accessible via the outer side 6a. It is preferable that a diaphragm 17 covers a region on the outer side 6a of the main body 2 which lies next to the outer contact-making means 3a, and the width 18 of which is greater than the width 19 of the region covered continuously by the outer contact-making means 3a. In particular, the width 18 is greater by a measure x than the width 19 of the outer contact-making means. In that region on the outer side 6a of the main body 2 which is covered by a diaphragm 17 and the outer contact-making means 3a, no filling material can flow directly into the cavities 5a. The region of the outer contact-making means 3a in which the gap 16 is arranged remains free of a diaphragm 17. In particular, as the cavities 5a are being filled with filling material, the filling material can flow in through the gap 16.

The filling material flows into the cavities 5a through the gap 16 and through a region on the outer side 6a of the main body 2 which is not covered by a diaphragm 17 or the outer contact-making means 3a. The filling material flows in symmetrically, for example. In particular, the material flows into the cavities 5a through the gap 16 at the same speed and with the same flow rate as through another region of the outer side 6a of the main body 2 which adjoins an end of a diaphragm 17 remote from the gap 16. In particular, the material flows through three inlet openings 26a, 26b, 26c. The inlet openings 26a, 26b, 26c are arranged, for example, at the ends of the regions covered by the diaphragms 17 and by the outer contact-making means 3a. In particular, streams 10a, 10b of the filling material which flow in through the inlet openings 26a, 26b, 26c come together in the cavities 5a beneath the diaphragms 17. On account of the symmetrical incoming flow of the filling material, the streams 10a, 10b come together in the center between the inlet openings 26a and 26b, and in the center between the inlet openings 26a and 26c. In particular, the streams 10a, 10b of the filling material come together in the respective center of the diaphragms 17. Since the diaphragms are arranged in such a manner that their respective center does not lie above the outer contact-making means 3a, the streams 10a, 10b come together in a region which does not lie beneath the outer contact-making means 3a.

Bubbles 25 can form in the filling material. The bubbles 25 preferably form in a region in which the streams 10a, 10b of the filling material come together. By displacing this point at which the streams come together to a region which does not lie beneath the outer contact-making means 3a, it is possible to reduce the risk of the formation of bubbles 20 in the region of the outer contact-making means 3a.

In a modified form, the exemplary embodiment shown in FIG. 7 can also have an outer contact-making means without a gap and a diaphragm arranged correspondingly asymmetrically over the outer contact-making means. It is decisive that the region in which the streams of the filling material come together does not lie in a region beneath the outer contact-making means.

REFERENCE SIGNS

1 Multi-layer component
2 Main body
3a First outer contact-making means
3b Second outer contact-making means
4 Contact element
5a First cavity
5b Second cavity
6a First outer side
6b Second outer side
7 Depth
8 Length
9 Filling material
10a, 10b Material streams
11 Chamber
13 Arrows
14 Sleeve
15 Clamping apparatus
16 Gap
17 Diaphragm
18 Width
19 Width
20a First internal electrode layer
20b Second internal electrode layer
21 Valve
22 Width
23 Piezoelectric layers
24 Probe
25 Bubbles
26a, 26b, 26c Inlet opening
x Oversize

The invention claimed is:

1. A method for filling at least one cavity (5a, 5b) of a multi-layer component (1) with filling material (9), comprising the following steps:
   A) providing a main body (2) of the multi-layer component (1), the main body (2) having at least one cavity (5a, 5b),
   B) placing the main body (2) in a chamber (11),
   C) generating a first pressure, the first pressure being a negative pressure,
   D) arranging the filling material (9) on the main body (2).

2. The method according to claim 1, comprising the following step:
   increasing the pressure in the chamber (11) to a second pressure after the main body (2) has been arranged in the filling material (9).

3. The method according to claim 2, wherein the pressure is increased by aerating the chamber (11).

4. The method according to either of claims 2 and 3, wherein the second pressure is an excess pressure.

5. The method according to claim 2, wherein filling material (9) is pressed into the at least one cavity (5a, 5b) by the increase in the pressure.

6. The method according to claim 1, wherein the filling material (9) has a viscosity of between 200 mPas and 2000 mPas.

7. The method according to claim 1, comprising the following step:
   curing the filling material (9).

8. The method according to claim 1, wherein the at least one cavity (5a, 5b) is produced by an etching method.

9. The method according to claim 1, wherein the at least one cavity (5a, 5b) has a width of between 1 µm and 5 µm.

10. The method according to claim 1, wherein the main body (2) has at least one internal electrode layer (20a, 20b), and wherein the at least one cavity (5a, 5b) is arranged in a plane with the at least one internal electrode layer (20a, 20b).

11. The method according to claim 1, wherein the main body (2) has at least one outer contact-making means (3a, 3b), which is arranged on an outer side (6a, 6b) of the main body and which at least partially covers the at least one cavity (5a, 5b).

12. The method according to claim 11, wherein a diaphragm (17) is arranged at least partially over the at least one cavity (5a, 5b).

13. The method according to claim 12, wherein the diaphragm (17) together with the outer contact-making means (3a, 3b) covers a continuous region on the outer side (6a, 6b) of the main body (2), and wherein, in a region which lies next to the outer contact-making means (3a, 3b), the diaphragm (17) has a width (18) which is greater than the width (19) of a region of the outer side (6a, 6b) covered continuously by the outer contact-making means.

14. A multi-layer component comprising:
a main body (2) with at least one cavity (5a, 5b),
wherein the cavity (5a, 5b) is filled with a filling material (9) which has a viscosity of between 200 mPas and 2000 mPas,
wherein the at least one cavity (5a, 5b) has a width of between 1 μm and 5 μm, and
wherein the filling material (9) is free of air bubbles.

\* \* \* \* \*